United States Patent
Schmidt

(10) Patent No.: US 11,881,450 B2
(45) Date of Patent: Jan. 23, 2024

(54) HIGH VOLTAGE TOLERANT CAPACITORS

(71) Applicant: Advanced Micro Devices, Inc., Santa Clara, CA (US)

(72) Inventor: Regina Tien Schmidt, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/509,909

(22) Filed: Oct. 25, 2021

(65) Prior Publication Data

US 2023/0130905 A1    Apr. 27, 2023

(51) Int. Cl.
    *H01L 23/522*    (2006.01)
    *H01L 21/768*    (2006.01)
    *H01L 49/02*    (2006.01)

(52) U.S. Cl.
    CPC ...... *H01L 23/5223* (2013.01); *H01L 21/7687* (2013.01); *H01L 28/75* (2013.01)

(58) Field of Classification Search
    CPC ......... H01L 28/40; H01L 28/60; H01L 28/75; H01L 28/77; H01L 28/86; H01L 28/87; H01L 28/88; H01L 28/90; H01L 28/91; H01L 28/92; H01L 21/7687; H01L 23/5223
    See application file for complete search history.

(56) References Cited

U.S. PATENT DOCUMENTS

| 9,129,817 | B2 | 9/2015 | Elsherbini et al. |
| 10,608,076 | B2 | 3/2020 | Schultz |
| 10,756,164 | B2 | 8/2020 | Schultz |
| 2013/0264681 | A1* | 10/2013 | Tu ............... H01L 23/5223 257/532 |
| 2013/0270675 | A1* | 10/2013 | Childs ............. H01L 28/60 257/532 |
| 2019/0279899 | A1* | 9/2019 | Maruthamuthu ... H01L 23/5223 |
| 2020/0020644 | A1* | 1/2020 | Lee ............... H01L 28/60 |
| 2021/0343650 | A1* | 11/2021 | Peng ............. H01L 23/5286 |

* cited by examiner

*Primary Examiner* — Omar F Mojaddedi
(74) *Attorney, Agent, or Firm* — Kowert, Hood, Munyon, Rankin & Goetzel, P.C.; Rory D. Rankin

(57) ABSTRACT

A system and method for fabricating on-die metal-insulator-metal capacitors capable of supporting relatively high voltage applications and increasing capacitance per area are described. In various implementations, an integrated circuit includes multiple metal-insulator-metal (MIM) capacitors. The MIM capacitors are formed between two signal nets such as two different power rails, two different control signals, or two different data signals. The integrated circuit includes multiple intermediate metal layers (or metal plates) formed between two signal nets. In high voltage regions, a MIM capacitor has one or more intermediate metal plates formed as floating plates between electrode metal plates. The floating plates have no connection to any power supply reference voltage level used by the integrated circuit. The insulating distance between the two electrode metal plates includes the thicknesses of the two dielectric layers, but the thickness of the conductive floating metal plate does not contribute to this insulating distance.

14 Claims, 7 Drawing Sheets

HIGH VOLTAGE TOLERANT CAPACITORS

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, as the number and size of passive components used in a design increase, the area consumed by these components also increases. Impedance matching circuits, harmonic filters, decoupling capacitors, bypass capacitors and so on are examples of these components.

Many manufacturing processes use on-die metal-insulator-metal (MIM) capacitors to provide capacitance in both on-die integrated circuits and off-chip integrated passive device (IPD) packages. A MIM capacitor is formed with two parallel metal plates separated by a dielectric layer. Generally speaking, each of the two metal plates and the dielectric layer is parallel to a semiconductor substrate surface. Such MIM capacitors are used in a variety of integrated circuits, including oscillators and phase-shift networks in radio frequency (RF) integrated circuits, as decoupling capacitors to reduce noise in both mixed signal integrated circuits and microprocessors as well as bypass capacitors near active devices in microprocessors to limit the parasitic inductance, and so on. MIM capacitors are also used as memory cells in a dynamic RAM.

Fabricating MIM capacitors is a challenging process. The material selection for the dielectric layer is limited as many of the materials used for the dielectric layer are able to diffuse with the metal layers used for the parallel metal plates. This limited selection can also reduce the capacitance per area that might otherwise be achieved. Further, the on-die region of the integrating circuit using the MIM capacitor can use a relatively high power supply reference voltage level. The MIM capacitor can fail under the high voltage stress, which can render the corresponding circuitry unsatisfactory for its intended purpose.

In view of the above, efficient methods and systems for fabricating on-die metal-insulator-metal capacitors capable of supporting relatively high voltage applications and increasing capacitance per area are desired.

Figure 1:
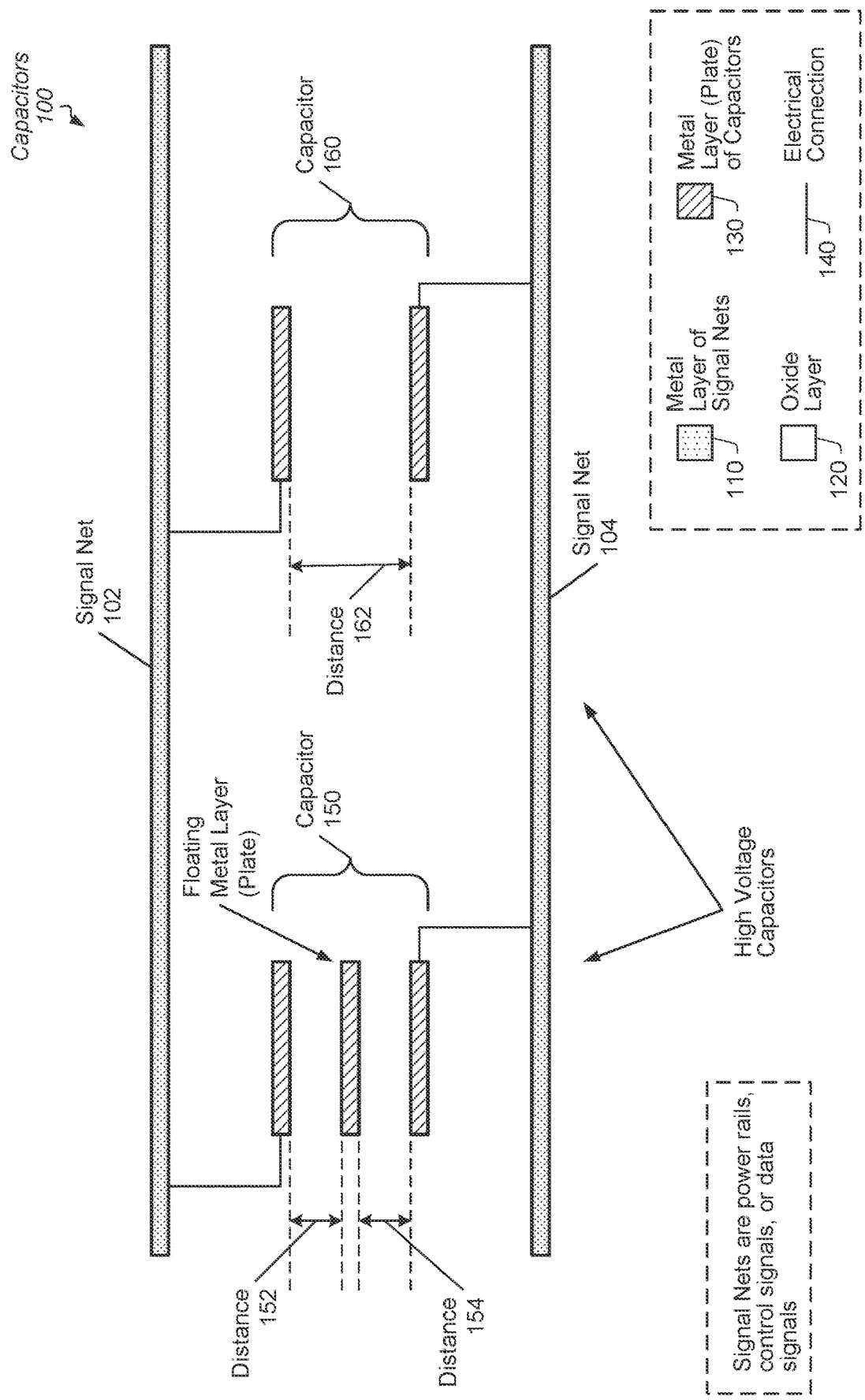
FIG. 1 is a generalized diagram of capacitors of an integrated circuit capable of supporting relatively high voltage applications and increasing capacitance per area.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for fabricating on-die metal-insulator-metal capacitors capable of supporting relatively high voltage applications and increasing capacitance per area are contemplated. In various implementations, an integrated circuit includes multiple metal-insulator-metal (MIM) capacitors used in one or more of a variety of types of circuits. Typically, an on-die capacitor is formed between two signal nets. In some implementations, the two signal nets are power rails charged to two different voltage levels. For example, a first signal net (or first power rail) is charged to a power supply reference voltage level, and a second signal net (or second power rail) is charged to a ground reference voltage level. In other implementations, the two signal nets are two different control signals or two different data signals used by the on-die integrated circuit.

One or more insulating dielectric layers are formed between the two metal layers used for the first signal net and the second signal net. These one or more insulating dielectric layers include at least one inter-level dielectric (ILD) layer. The semiconductor fabrication process used to create the integrated circuit also supports forming multiple intermediate metal layers in the ILD between the two signal nets. These intermediate metal layers are used to form capacitor plates. The maximum number of plates formed between the two signal nets is based on the semiconductor fabrication process used to create the integrated circuit. For example, the semiconductor fabrication process is capable of supporting three, four, or five intermediate metal layers between two signal nets. Another number of intermediate metal layers is possible and contemplated.

The integrated circuit includes one or more regions that are low voltage regions. The low voltage regions include circuitry that uses a relatively low power supply reference voltage level. The integrated circuit also includes one or more regions that are high voltage regions. The high voltage regions include circuitry that use a relatively high power supply reference voltage level that is greater than the low power supply reference voltage level. The MIM capacitors located in the low voltage regions of the integrated circuit have each formed intermediate metal layer (or metal plate) connected to one of the two signal nets. The dielectric layers between the intermediate metal plates are capable of tolerating a potential difference equal to the relatively low power supply reference voltage level. These dielectric layers are incapable of supporting a high voltage stress associated with the potential difference equal to the relatively high power supply reference voltage level.

In contrast to the low voltage regions, the MIM capacitors located in the high voltage regions of the integrated circuit have one or more intermediate metal layers (or metal plates) formed as floating plates between electrode metal plates. The floating metal plates have no connection to any power supply reference voltage level of the integrated circuit. Between the two electrode metal plates, a MIM capacitor in the high voltage region has at least one floating metal plate and at least two dielectric layers. The insulating distance between the two electrode metal plates includes the thicknesses of the two dielectric layers. However, the thickness of the conductive floating metal plate does not contribute to this insulating distance. The thicknesses of the two dielectric layers enable the MIM capacitor to tolerate a potential difference equal to the relatively high power supply reference voltage level and the low power supply reference voltage level. The thickness of the conductive floating metal plate reduces this insulating distance from a maximum value equal to the distance between the two electrode metal plates. The corresponding reduction in the insulating distance increases the capacitance per unit area of the MIM capacitor.

Turning now to FIG. 1, a generalized block diagram is shown of capacitors 100 of an integrated circuit capable of supporting relatively high voltage applications and increasing capacitance per unit area. A semiconductor fabrication process forms multiple intermediate metal layers (or metal plates) using metal layer 130 between two signal nets 102 and 104. The semiconductor fabrication process uses metal plates to form the high voltage metal-insulator-metal (MIM) capacitors 150 and 160 between the two signal nets 102 and 104. The semiconductor fabrication process (or process) forms the MIM capacitors 150 and 160 in the oxide layer 120 between the two signal nets 102 and 104. The process forms an electrical connection 140 between a particular metal plate and one of the two signal nets 102 and 104. The electrical connections 140 include one of a variety of types of vias. The MIM capacitor 150 (or capacitor 150) includes a floating metal plate between two electrode metal plates. The floating plates have no connection to any power supply reference voltage level used by the integrated circuit.

Although the capacitors 150 and 160 are shown relatively close to one another, it is possible that these capacitors are in different regions of the integrated circuit that use the signal nets 102 and 104. In other implementations, the capacitors 150 and 160 do not share the signal nets 102 and 104. The capacitors 150 and 160 are shown sharing the signal nets 102 and 104 for ease of illustration. As shown, one electrode metal plate of the capacitor 150 is connected to the signal net 102, whereas, the other electrode metal plate of the capacitor 150 is connected to the signal net 104. If the middle floating plate of the capacitor 150 was connected to one of the signal nets 102 and 104, then the capacitance of the capacitor 150 would increase. However, each of the insulating distances 152 and 154 is insufficient to tolerate a potential difference equal to a relatively high power supply reference voltage level. The capacitor 150 would fail under the relatively high voltage stress.

The insulating distance 162 of the capacitor 160 is sufficient to tolerate the potential difference equal to the relatively high power supply reference voltage level. However, the insulating distance 162 is also greater than the sum of the distances 152 and 154. Therefore, the capacitance per unit area of the capacitor 160 is less than the capacitance per unit area of the capacitor 150. The capacitor 150 is capable of supporting relatively high voltage applications while also increasing capacitance per unit area. Further details of the semiconductor fabrication processing steps used to create the capacitors 150 and 160 are provided in a description of method 600 (of FIG. 6). However, a brief description is provided in the following discussion.

In an implementation, the two signal nets 102 and 104 have static voltage levels over time. In another implementation, the two signal nets 102 and 104 have dynamic voltage levels over time. In some implementations, the two signal nets 102 and 104 are power rails charged to two different voltage levels. In one example, the signal net 102 is charged to a power supply reference voltage level, and the second signal net 104 is charged to a ground reference voltage level. In other implementations, the two signal nets 102 and 104 are two different control signals used by the integrated circuit. In yet other implementations, the two signal nets 102 and 104 are two different data signals used by the integrated circuit.

In one example, the signal net 102 is one signal route using a metal five (Metal 5, or M5) layer and the signal net 104 is signal route using a metal four (Metal 4, or M4) layer. For example, a metal zero (Metal 0, or M0) layer of the semiconductor fabrication process is the lowest metal layer formed above a gate region of a transistor. A metal one (Metal 1, or M1) layer is formed above the metal zero layer, and so on. In some designs, each of the signal nets 102 and 104 use a same conductive material such as metal layer 110. The metal layer 110 uses one of a variety of conductive materials such as copper, a mixture of copper and aluminum, or other. In other designs, the signal net 102 uses a different conductive material than what is used for signal net 104.

Although a single oxide layer 120 is shown as formed between the two metal layers used for the signal net 102 and the signal net 104, in some implementations, the process forms one or more insulating dielectric layers. These one or more insulating dielectric layers include at least one interlevel dielectric (ILD) layer. Each of the insulating dielectric layers has a particular dielectric constant and a particular thickness. Thicknesses of metal layers and dielectric layers are measured in the vertical direction when using the orientation shown in FIG. 1. For example, the distances 152, 154 and 162 are also referred to as the thicknesses 152, 154 and 162. Using this orientation, the widths of the metal layers 110 and 130 are measured in a direction going into the diagram, whereas, the lengths of the metal layers 110 and 130 are measured in the horizontal direction.

The process forms multiple intermediate metal plates that use the metal layer 130 between the two signal nets 102 and 104. The maximum number of metal plates formed between the signal nets 102 and 104 is based on the semiconductor fabrication process used to create the integrated circuit. For example, the semiconductor fabrication process is capable of supporting three, four, or five intermediate metal plates between the signal nets 102 and 104. Another number of intermediate metal plates is also possible and contemplated. In some designs, each of the metal plates uses a same conductive material such as metal layer 130. In an implementation, the metal layer 130 is one of tantalum nitride (TaN) and titanium nitride (TiN) in contrast to copper or a copper and aluminum mixture. In other implementations, the metal layer 130 uses copper, a mixture of copper and aluminum, or other. In other designs, one or more of the metal plates use a different conductive material than what is used for other metal plates between the signal nets 102 and 104. Similarly, in some designs, each of the metal plates uses a same thickness, whereas, in other designs, one or more of the metal plates use a different thickness than what is used for other metal plates.

To increase yield and increase rigidity of the dies of the wafers, in some implementations, the process creates a maximum number of metal plates in particular regions even when the metal plates are not used. In some designs, the maximum number of metal plates is three as shown in capacitors 100. The capacitor 150 uses each of the three available metal plates although the middle metal plate is a floating plate. In other designs, the process supports skipping the forming of unused metal plates. The capacitor 160 uses two metal plates by skipping the middle metal plate. Although the capacitor 150 is shown to include a single floating metal plate, in other implementations, the capacitor 150 includes two or more floating metal plates between the electrode metal plates when the process supports forming more than three metal plates.

Figure 2:
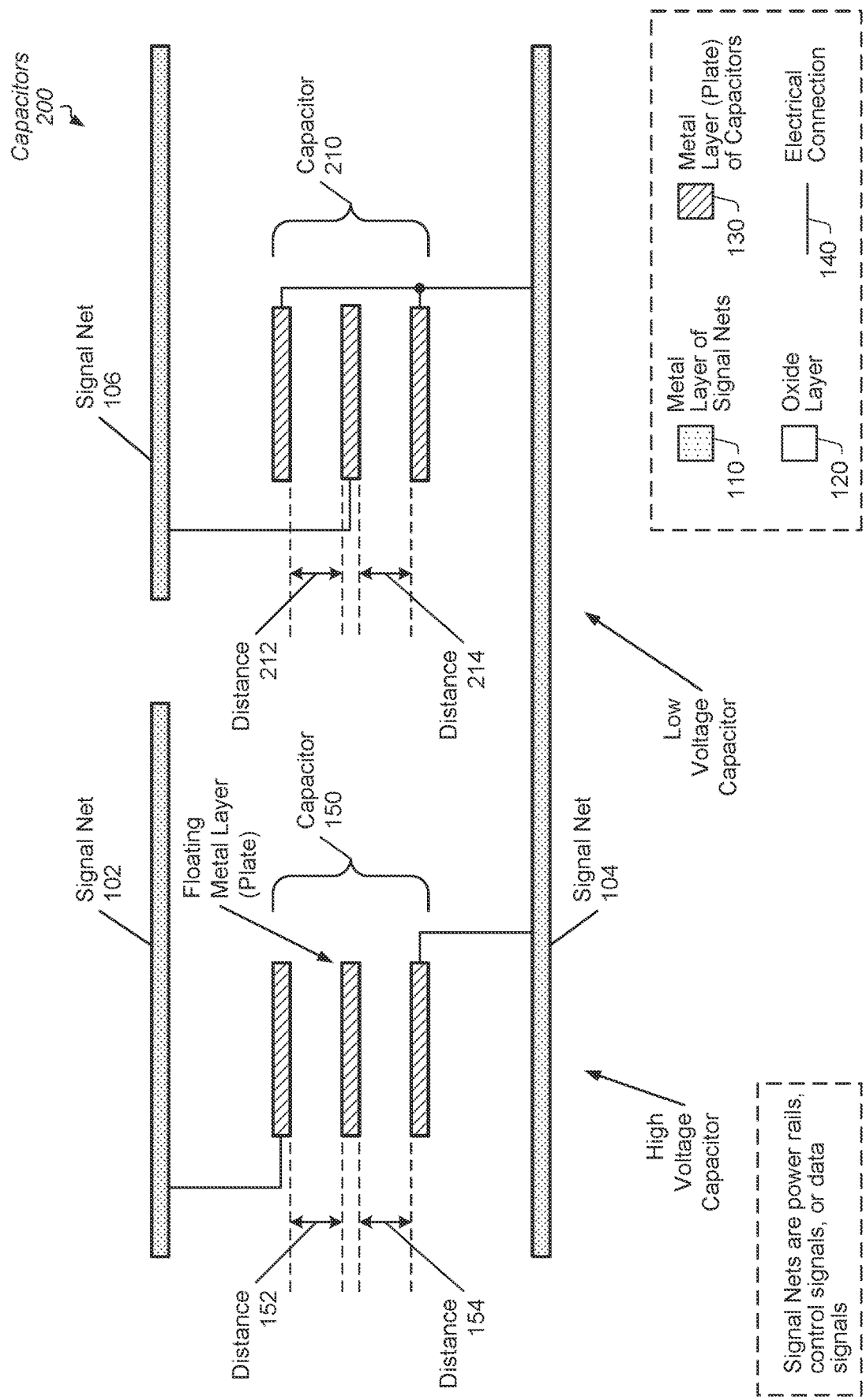
FIG. 2 is a generalized diagram of capacitors of an integrated circuit capable of supporting relatively high voltage applications and increasing capacitance per area.

Turning now to FIG. 2, a generalized block diagram is shown of capacitors 200 of an integrated circuit capable of supporting relatively high voltage applications and increasing capacitance per unit area. Signals and materials described earlier are numbered identically. The capacitors 200 includes the high voltage capacitor 150 and the low voltage capacitor 210. The capacitor 150 is connected to the signal net 102, which provides a relatively high power supply reference voltage level. The capacitor 210 is connected to the signal net 106, which provides a relatively low power supply reference voltage level. The signal net 106 is physically and electrically separated from the signal net 102 although the signal net 106 is formed with a same metal layer as the signal net 102. In one example, each of the signal nets 102 and 106 uses a metal five (M5) layer. Similar to the signal net 102, the signal net 106 is one of a power rail used by the integrated circuit, a control signal used by the integrated circuit, and a data signal used by the integrated circuit. Although it is shown that each of the capacitors 150 and 210 share the signal net 104, in other implementations, the capacitors 150 and 210 are connected to different signal nets. However, in each implementation, the potential difference across the capacitor 150 is appreciably greater than the potential difference across the capacitor 210. Similar to the capacitor 150, the capacitor 210 includes three metal plates between the two signal nets. The capacitor 210 uses each of the three metal plates as electrode metal plates. The top and bottom metal plates of the capacitor 210 are connected to the signal net 104. The middle metal plate is connected to the signal net 102.

The equivalent capacitance of capacitor 210 is a sum of the capacitances of the first capacitance that uses the insulating distance 212 and the second capacitance that uses the insulating distance 214. These two capacitances of the capacitor 210 are connected in a parallel configuration. The first capacitance includes the ratio of the overlap area of the top metal plate and the middle metal plate to the insulating distance 212. The dielectric constant of the dielectric material, such as oxide layer 120, between the two metal plates also affects the capacitance. Similarly, the second capacitance includes the ratio of the overlap area of the middle metal plate and the bottom metal plate to the insulating distance 214. The dielectric constant of the dielectric material, such as oxide layer 120, between the two metal plates also affects the capacitance.

The equivalent capacitance of capacitor 210 is greater than the total capacitance of capacitor 150. The capacitance of capacitor 150 includes the ratio of the overlap area of the top metal plate and the bottom metal plate to the sum of the insulating distances 152 and 154. The dielectric constant of the dielectric material should be the same as used for the capacitor 210. Therefore, the insulating distance between the two electrode metal plates of capacitor 150 includes the thicknesses of the two dielectric layers such as distances 152 and 154. However, the thickness of the conductive floating metal plate does not contribute to this insulating distance. Although the capacitor 150 provides less capacitance than capacitor 210, the capacitor 150 tolerates higher voltage stress. Without using a different dielectric material with a different dielectric constant and without changing the semiconductor fabrication process, the capacitor 150 provides a high voltage capacitor. By utilizing the floating metal plate, the capacitor 150 provides reliability for high voltage applications without adding additional manufacturing cost.

Figure 3:
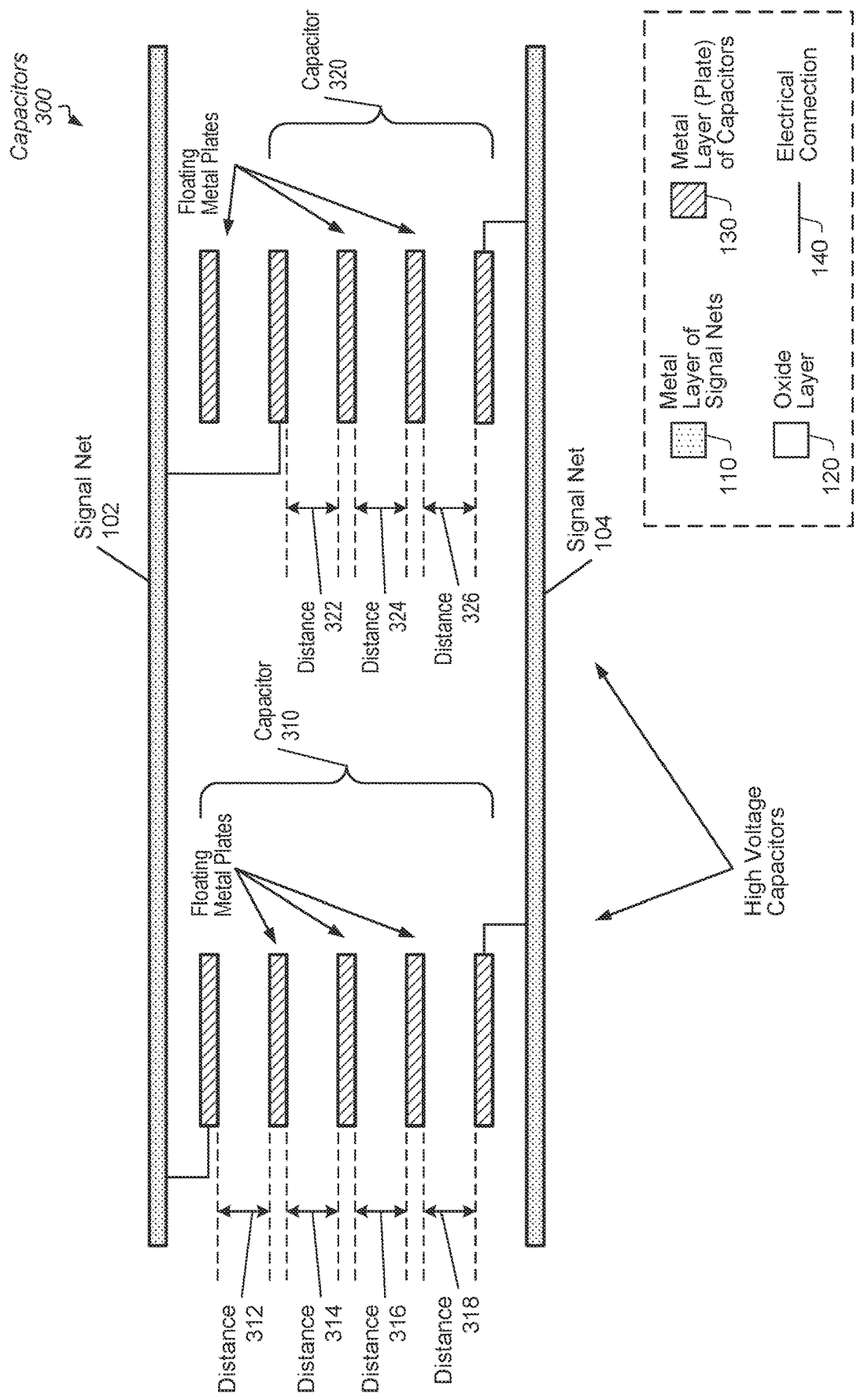
FIG. 3 is a generalized diagram of capacitors of an integrated circuit capable of supporting relatively high voltage applications and increasing capacitance per area.

Referring to FIG. 3, a generalized block diagram is shown of capacitors 300 of an integrated circuit capable of supporting relatively high voltage applications and increasing capacitance per unit area. Signals and materials described earlier are numbered identically. The capacitors 300 includes the high voltage capacitors 310 and 320. Here, in this example, the semiconductor fabrication process supports forming at least five metal plates between the two signal nets 102 and 104. The capacitor 310 includes three floating metal plates between electrode metal plates. The capacitor 320 includes two floating metal plates between electrode metal plates.

The capacitance of capacitor 310 includes the ratio of the overlap area of the top metal plate adjacent to signal net 102 and the bottom metal plate adjacent to signal net 104 to the sum of the insulating distances 312, 314, 316 and 318. Therefore, the insulating distance between the two electrode metal plates of capacitor 310 excludes the thicknesses of the three floating metal plates between the two electrode metal plates. The capacitance of capacitor 320 includes the ratio of the overlap area of the second metal plate from the signal net 102 and the bottom metal plate adjacent to signal net 104 to the sum of the insulating distances 322, 324 and 326. The floating metal plate adjacent to the signal net 102 does not contribute to the capacitance of capacitor 320. The insulating distance between the two electrode metal plates of capacitor 320 excludes the thicknesses of the two floating metal plates between the two electrode metal plates.

The sum of the distances 324, 326 and 328 is less than the sum of the distances 312, 314, 316 and 318. Therefore, the capacitance of capacitor 320 is greater than the capacitance of capacitor 310. Using the same dimensions, each of the capacitors 310 and 320 has a smaller capacitance than the capacitor 150 (of FIGS. 1-2). However, each of the capacitors 310 and 320 is able to tolerate a greater potential difference between the electrode metal plates than the capacitor 150.

Figure 4:
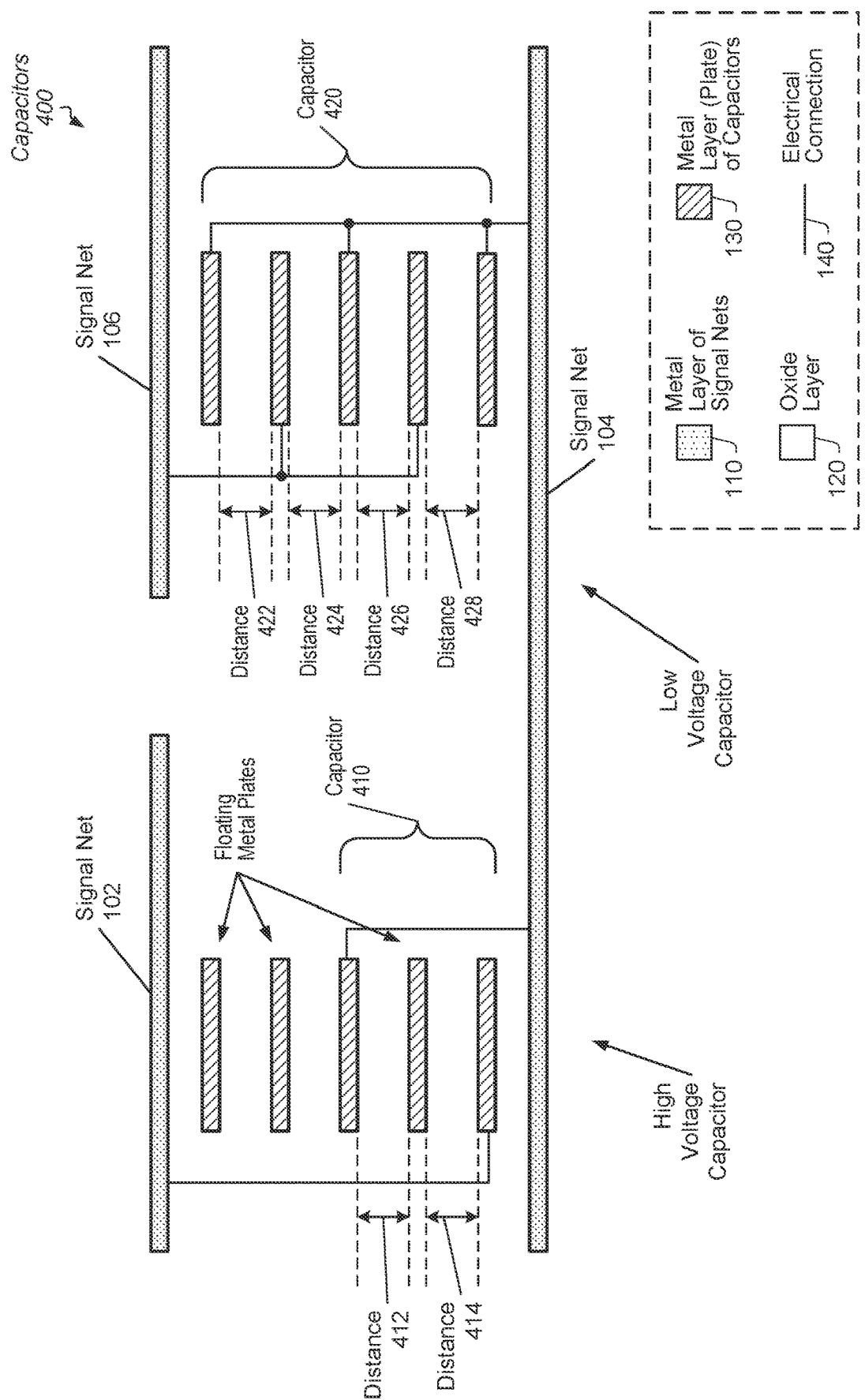
FIG. 4 is a generalized diagram of capacitors of an integrated circuit capable of supporting relatively high voltage applications and increasing capacitance per area.

Referring to FIG. 4, a generalized block diagram is shown of capacitors 400 of an integrated circuit capable of supporting relatively high voltage applications and increasing capacitance per unit area. Signals and materials described earlier are numbered identically. The capacitors 400 includes the high voltage capacitor 410 and the low voltage capacitor 420. Here, in this example, the semiconductor fabrication process supports forming at least five metal plates between the two signal nets 102 and 104 and between the two signal nets 106 and 104. The capacitor 410 includes one floating metal plate between electrode metal plates. The capacitor 420 includes four capacitors connected in a parallel configuration, and each capacitor has no floating metal plate between electrode metal plates.

The capacitance of capacitor 410 includes the ratio of the overlap area of the electrode metal plates, such as the middle metal plate and the bottom metal plate, to the sum of the insulating distances 412 and 414. The insulating distance between the two electrode metal plates of capacitor 410 excludes the thickness of the floating metal plate between the two electrode metal plates. The two floating metal plates located near the signal net 102 do not contribute to the capacitance of capacitor 410.

The equivalent capacitance of capacitor 420 is a sum of the capacitances of the four capacitances that use the insulating distances 422, 424, 426 and 428. These four capacitances of the capacitor 420 are connected in a parallel configuration. The first capacitance includes the ratio of the overlap area of the top metal plate and the adjacent metal plate to the insulating distance 422. The second capacitance includes the ratio of the overlap area of the second metal plate from the top and the middle metal plate to the insulating distance 424. The third capacitance and the fourth capacitance are determined in a similar manner using the insulating distances (thicknesses) 426 and 428. The capacitance of capacitor 420 is greater than the capacitance of capacitor 410. However, the capacitor 410 is able to tolerate a greater potential difference between the electrode metal plates than the capacitor 420.

Figure 5:
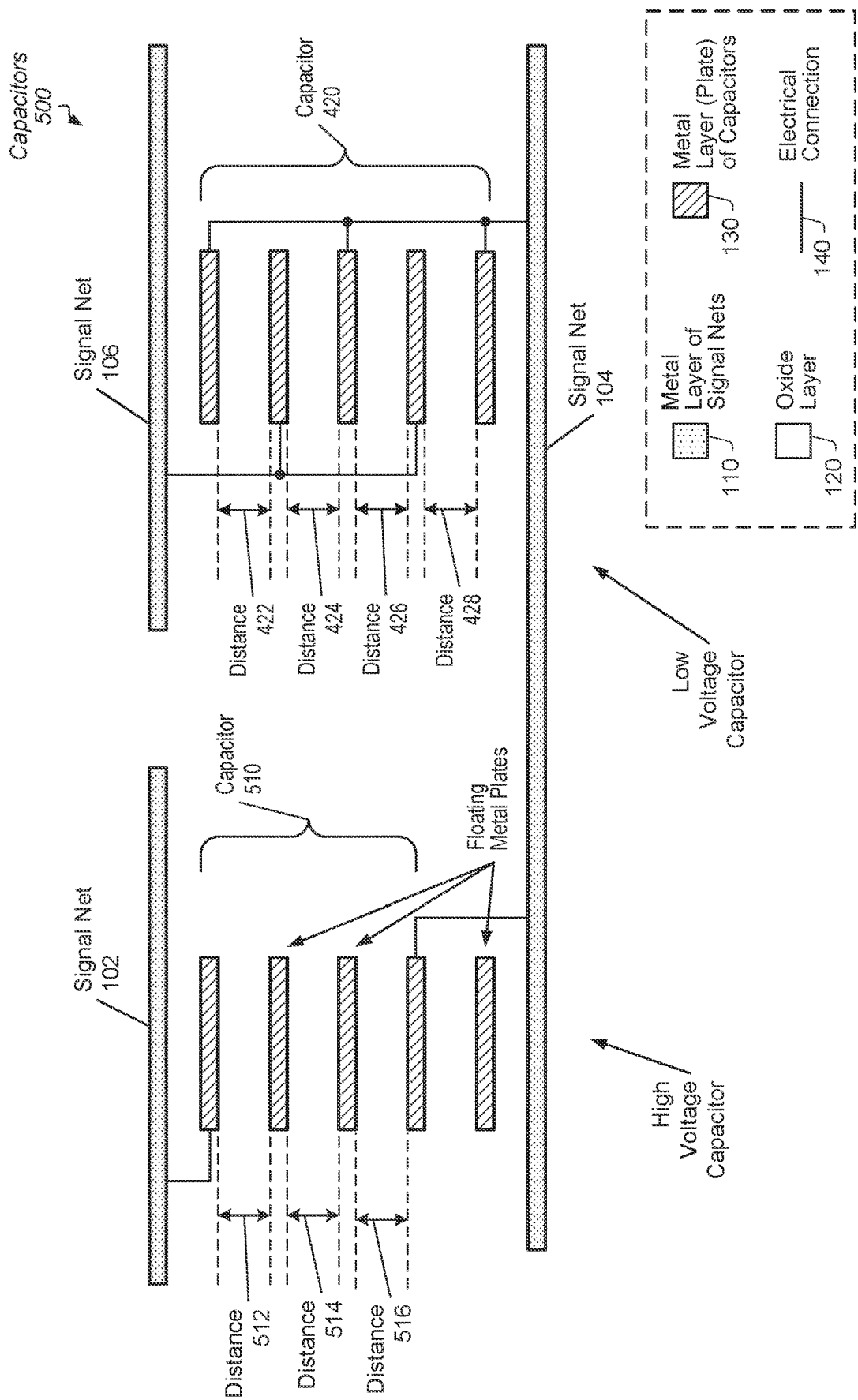
FIG. 5 is a generalized diagram of capacitors of an integrated circuit capable of supporting relatively high voltage applications and increasing capacitance per area.

Referring to FIG. 5, a generalized block diagram is shown of capacitors 500 of an integrated circuit capable of supporting relatively high voltage applications and increasing capacitance per unit area. Signals and materials described earlier are numbered identically. The capacitors 500 includes the high voltage capacitor 510 and the low voltage capacitor 420. Here, in this example, the semiconductor fabrication process supports forming at least five metal plates between the two signal nets 102 and 104 and between the two signal nets 106 and 104. The capacitor 510 includes two floating metal plates between electrode metal plates.

The capacitance of capacitor 510 includes the ratio of the overlap area of the electrode metal plates, such as the middle metal plate and the bottom metal plate, to the sum of the insulating distances (thicknesses) 512, 514 and 516. The insulating distance between the two electrode metal plates of capacitor 510 excludes the thickness of the two floating metal plates between the two electrode metal plates. The floating metal plates located at the bottom adjacent to the signal net 104 does not contribute to the capacitance of capacitor 510. The capacitance of capacitor 420 is greater than the capacitance of capacitor 510. However, the capacitor 510 is able to tolerate a greater potential difference between the electrode metal plates than the capacitor 420. When using the same dimensions, the capacitance of capacitor 510 is also less than the capacitance of capacitance of capacitor 410 (of FIG. 4). For example, the sum of the insulating distances (thicknesses) 512, 514 and 516 is greater than the sum of the insulating distances (thicknesses) 412 and 414. However, the capacitor 510 is able to tolerate a greater potential difference between the electrode metal plates than the capacitor 410 although the capacitor 410 is also a high voltage capacitor.

Figure 6:
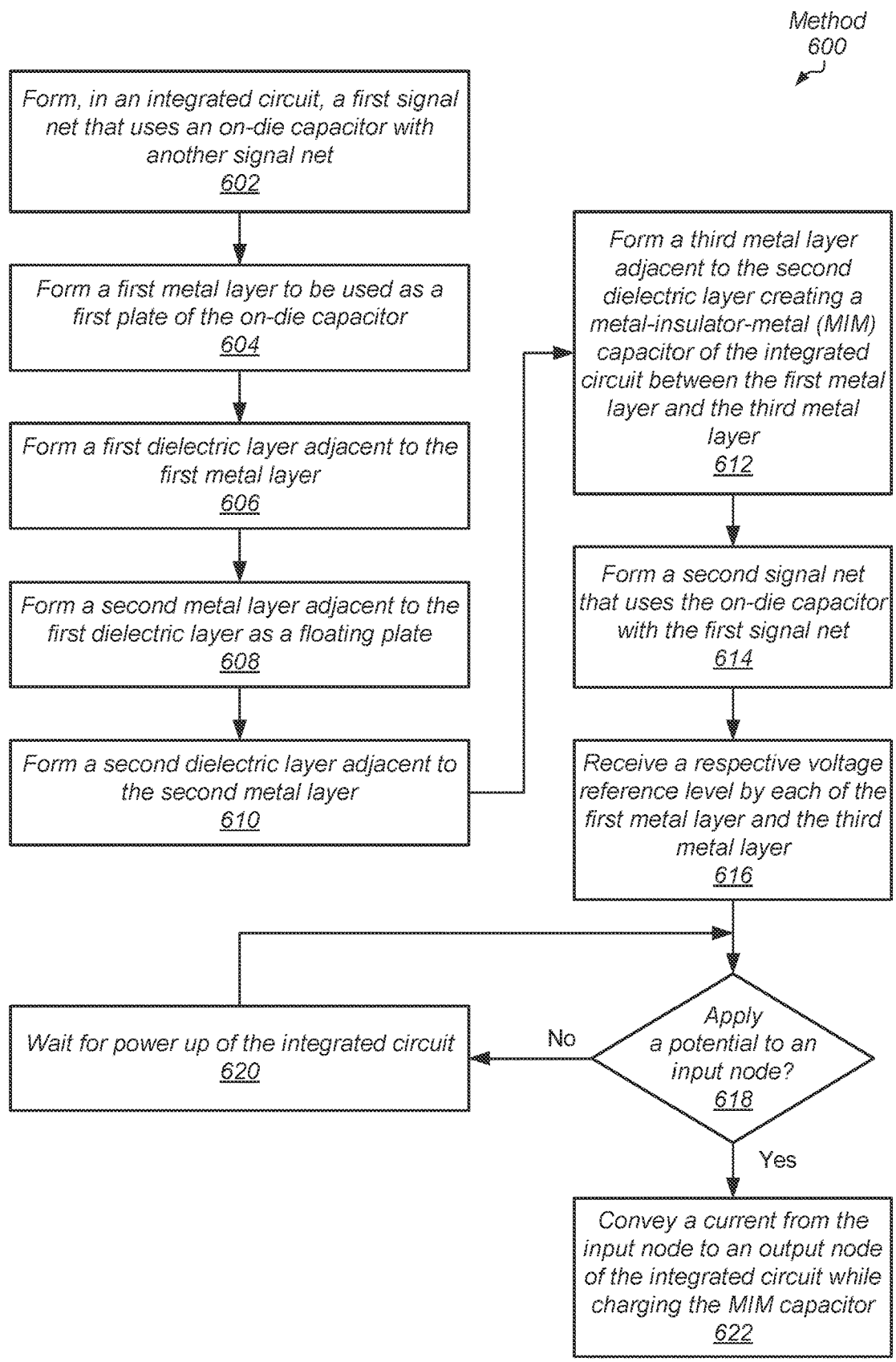
FIG. 6 is a generalized diagram of a method for forming capacitors of an integrated circuit capable of supporting relatively high voltage applications and increasing capacitance per area.

Turning to FIG. 6, a generalized block diagram of a method 600 for forming capacitors of an integrated circuit capable of supporting relatively high voltage applications and increasing capacitance per area is shown. For purposes of discussion, the steps in this implementation are shown in sequential order. However, in other implementations some steps occur in a different order than shown, some steps are performed concurrently, some steps are combined with other steps, and some steps are absent. Typically, an on-die capacitor is formed between two signal nets. In some implementations, the two signal nets are power rails charged to two different voltage levels. A first signal net (or first power rail) is charged to a power supply reference voltage level, and a second signal net (or second power rail) is charged to a ground reference voltage level. In other implementations, the two signal nets are two different control signals or two different data signals used by the on-die integrated circuit. In one example, the first signal net is a metal four (M4) layer and the second signal net is a metal five (M5) layer. In one example, the first signal net is equivalent to the signal net 104 and the second signal net is equivalent to the signal net 102 (of FIGS. 1-5). One or more insulating dielectric layers are formed between the two metal layers used for the first signal net and the second signal net. These one or more insulating dielectric layers include at least one inter-level dielectric (ILD). A semiconductor fabrication process (or process) forms, in an integrated circuit, the first signal net that uses an on-die capacitor with another signal net (block 602).

To form the first signal net, the process forms a metal layer on top of an oxide layer, such as the inter-level dielectric (ILD). The ILD is used to insulate metal layers, which are used for interconnects. In some implementations, the ILD is silicon dioxide. In other implementations, the ILD is one of a variety of low-k dielectrics containing carbon or fluorine. The low-k dielectrics provide a lower capacitance between the metal layers, and thus, reduce performance loss, power consumption, and cross talk between interconnect routes. A chemical mechanical planarization (CMP) step is used to remove unwanted ILD and to polish the remaining ILD. The CMP step achieves a near-perfect flat and smooth surface upon which further layers are built. Following, the process deposits the metal layer to be used as the first signal net. The metal layer is one of a variety of conductive materials such as copper, a mixture of copper and aluminum, and so on.

In some implementations, the process uses a dual damascene process to form the metal layer of the first signal net, whereas, in other implementations, the process uses a single damascene process. These and other techniques are contemplated. When the process uses copper for the first signal net, the process deposits a liner on the ILD before forming the metal layer. The liner uses a tantalum (Ta) based barrier material to prevent the copper from diffusing into the ILD and to act as an adhesion layer for the copper. Next, the process deposits a thin copper seed layer by physical vapor diffusion (PVD) followed by electroplating of copper. Afterward, the process polishes the excess copper metal and deposits a capping layer typically SiN (silicon mononitride). The process forms an additional oxide layer on top of the first signal net of a controlled thickness. In various implementations, the thickness of the oxide layer on top of the first signal net is at least an order of magnitude greater than a thickness of a thin gate silicon dioxide layer formed for active devices such as transistors. The process deposits the oxide layer using a combination of gasses such as dichlorosilane or silane with oxygen precursors, such as oxygen and nitrous oxide, typically at pressures from a few millitorr to a few torr.

The process forms a first metal layer to be used as a first plate of the on-die capacitor (block 604). The process uses one of a variety of conductive materials and methods to form the first metal layer as described earlier. In some implementations, the process uses a same conductive material for the first metal layer as used for the first signal net, whereas, in other implementations, the first signal net and the first metal layer use different conductive materials. For example, in some implementations, the first metal layer is one of tantalum nitride (TaN) and titanium nitride (TiN) in contrast to copper or a copper and aluminum mixture. In such implementations, the process forms the first metal layer using atomic layer deposition (ALD), or physical vapor deposition (PVD) such as a sputter technique.

The process forms a first dielectric layer adjacent to the first metal layer (block 606). In an implementation, the process uses an atomic layer deposition to form a relatively high-K oxide dielectric on the first metal layer. The process forms a second metal layer as a floating plate adjacent to the first dielectric layer (block 608). The process deposits the second metal layer on top of the first dielectric layer, and forms (deposits) a second dielectric layer adjacent to the second metal layer (block 610). The second metal layer that is used as a floating plate has no connection to a voltage reference level used by the integrated circuit. The process uses similar techniques as described earlier to form the second metal layer and the second dielectric layer. In some implementations, the process uses a same conductive material for the second metal layer as used for the first metal layer, whereas, in other implementations, the first metal layer and the second metal layer use different conductive materials. Similarly, in some implementations, the process uses a same insulating material for the second dielectric layer as used for the first dielectric layer, whereas, in other implementations, the first dielectric layer and the second dielectric layer use different insulating materials.

The process forms a third metal layer adjacent to the second dielectric layer creating a metal-insulator-metal (MIM) capacitor of the integrated circuit between the first metal layer and the third metal layer (block 612). The conductive material of the third metal layer is the same conductive material used for one of the first signal net, the first metal layer, and the second metal layer. Alternatively, the process uses a different conductive material. The MIM capacitor has two dielectric layers with the second metal layer in the middle separating the two dielectric layers. The second metal layer is also a floating plate.

Each of these layers of the MIM capacitor has a thickness. In some implementations, one or more of the layers have a same thickness as another layer. For example, in an implementation, the first metal layer and the third metal layer have a same thickness, and the first dielectric layer and the second dielectric layer have a same thickness. In another implementation, each of the layers has a unique, respective thickness. The thickness of the second metal layer reduces the insulating distance between the first metal layer and the third metal layer. The reduced insulating distance increases the capacitance of the MIM capacitor.

The process forms a second signal net that uses the on-die capacitor with the first signal net (block 614). The process uses similar techniques described earlier for forming the first signal net and its corresponding ILD. The process forms one of a variety of via types to physically connect the first signal net to the first metal layer, and to physically connect the third metal layer to the second signal net. Therefore, each of the first metal layer and the third metal layer receives a respective voltage reference level applied to the first signal net and the second signal net (block 616).

If a potential is not applied to an input node of the integrated circuit ("no" branch of the conditional block 618), then the integrated circuit waits for power up (block 620). However, if a potential is applied to the input node of the integrated circuit ("yes" branch of the conditional block 618), then the circuitry of the integrated circuit conveys a current from the input node to an output node of the integrated circuit while charging the MIM capacitor (block 622).

Figure 7:
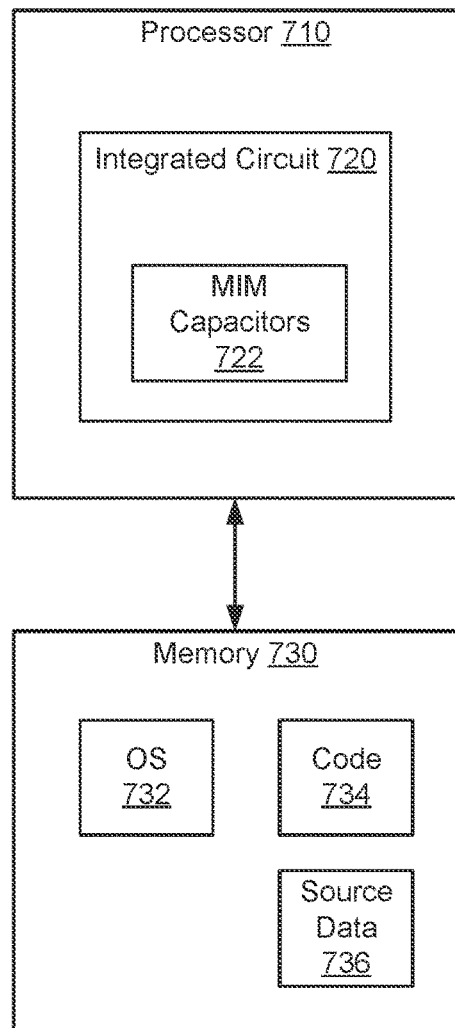
FIG. 7 is a generalized diagram of computing system with capacitors of an integrated circuit capable of supporting relatively high voltage applications and increasing capacitance per area.

Referring to FIG. 7, one implementation of a computing system 700 is shown. The computing system 700 includes the processor 710 and the memory 730. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 700 includes one or more of other processors of a same type or a different type than processor 710, one or more peripheral devices, a network interface, one or more other memory devices, and so forth. In some implementations, the functionality of the computing system 700 is incorporated on a system on chip (SoC). In other implementations, the functionality of the computing system 700 is incorporated on a peripheral card inserted in a motherboard. The computing system 700 is used in any of a variety of computing devices such as a server computer, a desktop computer, a tablet computer, a laptop, a smartphone, a smartwatch, a gaming console, a personal assistant device, and so forth.

The processor 710 includes hardware such as circuitry. For example, the processor 710 includes at least one integrated circuit 720, which utilizes MIM capacitors 722. The integrated circuit 720 uses the MIM capacitors 722 for a variety of applications such as decoupling two signal nets from one another, smoothing or stabilizing the current and voltage output of power supplies and voltage regulators, adjusting frequency tuning circuitry, reconstructing receiving signals from transmission lines, and so on. Other examples of applications that use the MIM capacitors 722 are oscillators and phase-shift networks in radio frequency (RF) integrated circuits, bypass capacitors near active devices in microprocessors to limit the parasitic inductance, memory cell data storage in dynamic RAM, and so on. The MIM capacitors 722 are capable of supporting relatively high voltage applications and increasing capacitance per area. For example, one or more of the MIM capacitors 722 instantiated in the integrated circuit 720 use configurations as shown earlier for capacitors 100-500 (of FIGS. 1-5).

In various implementations, the processor 710 includes one or more processing units. In some implementations, each of the processing units includes one or more processor cores capable of general-purpose data processing, and an associated cache memory subsystem. In such an implementation, the processor 710 is a central processing unit (CPU). In another implementation, the processing cores are compute units, each with a highly parallel data microarchitecture with multiple parallel execution lanes and an associated data storage buffer. In such an implementation, the processor 710 is a graphics processing unit (GPU), a digital signal processor (DSP), or other.

In some implementations, the memory 730 includes one or more of a hard disk drive, a solid-state disk, other types of flash memory, a portable solid-state drive, a tape drive and so on. The memory 730 stores an operating system (OS) 732, one or more applications represented by code 734, and at least source data 736. Memory 730 is also capable of storing intermediate result data and final result data generated by the processor 710 when executing a particular application of code 734. Although a single operating system 732 and a single instance of code 734 and source data 736 are shown, in other implementations, another number of these software components are stored in memory 730. The operating system 732 includes instructions for initiating the boot up of the processor 710, assigning tasks to hardware circuitry, managing resources of the computing system 700 and hosting one or more virtual environments.

Each of the processor 710 and the memory 730 includes an interface unit for communicating with one another as well as any other hardware components included in the computing system 700. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage.

Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   a first metal layer;
   a first dielectric layer adjacent to the first metal layer;
   a second metal layer adjacent to the first dielectric layer;
   a second dielectric layer adjacent to the second metal layer; and
   a third metal layer adjacent to the second dielectric layer, wherein a metal-insulator-metal (MIM) capacitor is formed between the first metal layer and the third metal layer; and
   wherein:
      each of the first metal layer and the third metal layer is connected to a respective voltage reference level with one of the respective voltage reference levels being a first power supply voltage reference level that is different from a second power supply voltage level used in another region of the integrated circuit; and
      the second metal layer is a floating net with no connection to a voltage reference level used by the integrated circuit.

2. The integrated circuit as recited in claim 1, further comprising one or more metal layers in addition to the second metal layer between the first metal layer and the third metal layer that are floating with no connection to a voltage reference level used by the integrated circuit.

3. The integrated circuit as recited in claim 1, wherein the first metal layer is connected, via a fourth metal layer, to a first signal net that uses the first power supply voltage reference level.

4. The integrated circuit as recited in claim 3, wherein:
   the third metal layer is connected to a second signal net via a fifth metal layer; and
   the fourth metal layer and the fifth metal layer are adjacent signal metal layers.

5. The integrated circuit as recited in claim 4, wherein the first metal layer, the second metal layer and the third metal layer are metal layers between adjacent signal metal layers.

6. The integrated circuit as recited in claim 1, further comprising one or more metal layers between the first metal layer and a fourth metal layer that are floating with no connection to a voltage reference level used by the integrated circuit.

7. The integrated circuit as recited in claim 1, wherein:
   each of the first dielectric layer and the second dielectric layer comprises a given oxide layer; and
   the given oxide layer comprises an oxide layer surrounding the first metal layer, the second metal layer, and the third metal layer.

8. A method for fabricating an integrated circuit comprising:
   forming a first metal layer;
   forming a first dielectric layer adjacent to the first metal layer;
   forming a second metal layer adjacent to the first dielectric layer;

forming a second dielectric layer adjacent to the second metal layer; and forming a third metal layer adjacent to the second dielectric layer, wherein a metal-insulator-metal (MIM) capacitor of an integrated circuit is formed between the first metal layer and the third metal layer; and receiving a respective voltage reference level by each of the first metal layer and the third metal layer with one of the respective voltage reference levels being a first power supply voltage reference level that is different from a second power supply voltage level used in another region of the integrated circuit; and wherein the second metal layer is a floating net with no connection to a voltage reference level used by the integrated circuit.

9. The method as recited in claim 8, further comprising receiving, by one or more metal layers in addition to the second metal layer between the first metal layer and the third metal layer, no voltage reference level used by the integrated circuit.

10. The method as recited in claim 8, further comprising receiving, by the first metal layer via a fourth metal layer, a first signal net that uses the first power supply voltage reference level.

11. The method as recited in claim 10, further comprising:

receiving, by the second metal layer, a second signal net via a fifth metal layer; and placing the fourth metal layer and the fifth metal layer as adjacent signal metal layers.

12. The method as recited in claim 10, further comprising placing the first metal layer, the second metal layer and the third metal layer as metal layers between adjacent signal metal layers.

13. The method as recited in claim 8, further comprising forming one or more metal layers between the first metal layer and a fourth metal layer that are floating with no connection to a voltage reference level used by the integrated circuit.

14. The method as recited in claim 13, further comprising forming each of the first dielectric layer and the second dielectric layer as a given oxide layer, wherein the given oxide layer comprises an oxide layer surrounding the first metal layer, the second metal layer, and the third metal layer.

* * * * *